United States Patent
Sawada et al.

(10) Patent No.: US 11,323,142 B2
(45) Date of Patent: *May 3, 2022

(54) RADIO FREQUENCY MODULE AND COMMUNICATION DEVICE

(71) Applicant: Murata Manufacturing Co., Ltd., Nagaokakyo (JP)

(72) Inventors: Yoichi Sawada, Nagaokakyo (JP); Takayuki Shinozaki, Nagaokakyo (JP); Yukiya Yamaguchi, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/019,356

(22) Filed: Sep. 14, 2020

(65) Prior Publication Data

US 2021/0091802 A1    Mar. 25, 2021

(30) Foreign Application Priority Data

Sep. 20, 2019   (JP) .............................. JP2019-171752

(51) Int. Cl.
*H04B 1/40* (2015.01)
*H04B 1/00* (2006.01)
*H04B 1/38* (2015.01)
*H04B 1/48* (2006.01)
*H01L 23/60* (2006.01)
(Continued)

(52) U.S. Cl.
CPC ................ *H04B 1/04* (2013.01); *H03F 1/56* (2013.01); *H03F 3/245* (2013.01); *H03H 7/0115* (2013.01); *H03F 2200/171* (2013.01); *H03F 2200/222* (2013.01); *H03F 2200/387* (2013.01);
(Continued)

(58) Field of Classification Search
None
See application file for complete search history.

(56) References Cited

U.S. PATENT DOCUMENTS 7,855,983 B2 * 12/2010 Knecht .................. H05K 1/141
                                                      370/280
10,797,741 B2 * 10/2020 Naniwa ..................... H01P 5/02
(Continued)

FOREIGN PATENT DOCUMENTS

CN         211266541 U   *  8/2020
JP         2017-098630 A    6/2017
(Continued)

OTHER PUBLICATIONS

Korean Office Action dated Aug. 27, 2021, in corresponding Korean Patent Application No. 10-2020-0110734.

*Primary Examiner* — Pablo N Tran
(74) *Attorney, Agent, or Firm* — Xsensus LLP

(57) ABSTRACT

A radio frequency module includes: a module board including a first principal surface and a second principal surface on opposite sides of the module board; an antenna connection terminal; a diplexer connected to the antenna connection terminal and including at least a first inductor which is a chip inductor; a transmission power amplifier; and a first circuit component disposed on a transmission path connecting the diplexer and the transmission power amplifier. The first inductor is disposed on the first principal surface, and one of the transmission power amplifier and the first circuit component is disposed on the second principal surface.

19 Claims, 5 Drawing Sheets

(51) Int. Cl.
*H04B 1/04* (2006.01)
*H03F 3/24* (2006.01)
*H03H 7/01* (2006.01)
*H03F 1/56* (2006.01)

(52) U.S. Cl.
CPC .............. *H03F 2200/451* (2013.01); *H04B 2001/0416* (2013.01)

(56) References Cited

U.S. PATENT DOCUMENTS

| | | | |
|---|---|---|---|
| 10,972,593 B1* | 4/2021 | Sawada | H04B 1/0057 |
| 2009/0289853 A1* | 11/2009 | Tinaphong | H01Q 21/29 |
| | | | 343/700 MS |
| 2012/0306716 A1* | 12/2012 | Satake | H03K 17/693 |
| | | | 343/841 |
| 2014/0132365 A1* | 5/2014 | Nakamura | H03H 11/348 |
| | | | 333/133 |
| 2014/0197902 A1* | 7/2014 | Zuo | H03H 7/461 |
| | | | 333/132 |
| 2017/0201291 A1* | 7/2017 | Gu | H01L 21/76898 |
| 2019/0378790 A1* | 12/2019 | Bohr | H01L 29/41791 |

FOREIGN PATENT DOCUMENTS

| | | |
|---|---|---|
| KR | 10-2017-0139105 A | 12/2017 |
| WO | 2018/168500 A1 | 9/2018 |

\* cited by examiner

RADIO FREQUENCY MODULE AND COMMUNICATION DEVICE

CROSS REFERENCE TO RELATED APPLICATION

The present application is based on and claims priority of Japanese Patent Application No. 2019-171752 filed on Sep. 20, 2019. The entire disclosure of the above-identified application, including the specification, drawings and claims is incorporated herein by reference in its entirety.

FIELD

The present disclosure relates to a radio frequency module and a communication device.

BACKGROUND

In mobile communication apparatuses such as mobile phones, the arrangement of circuit elements included in radio frequency front-end circuits is becoming complex, particularly with developments in multiband technologies.

Japanese Unexamined Patent Application Publication No. 2017-98630 discloses a front-end module including: a plurality of transmission and reception paths for transmitting and receiving radio frequency signals of predetermined communication bands (frequency bands); an input switch to which the plurality of transmission and reception paths are connected; and an antenna matching circuit connected between the input switch and an antenna connection terminal. The antenna matching circuit includes at least one of an inductor or a capacitor, and is an LC filter having a filtering function. The front-end module reduces deterioration of isolation between the input and the output by optimizing the arrangement, in the peripheral portion of a switch IC, of filters including the above LC filter and matching circuits including the above antenna matching circuit, which are disposed on the transmission and reception paths.

SUMMARY

Technical Problems

When the front-end module disclosed in Japanese Unexamined Patent Application Publication No. 2017-98630 is realized as a miniaturized radio frequency module, however, electromagnetic coupling may occur between a circuit component disposed on a transmission path and an inductor of an LC filter (an antenna matching circuit). In that case, a harmonic of a high-output transmission signal transferred via a transmission path or spurious waves of intermodulation distortion between the transmission signal and another radio frequency signal may flow into a reception path due the electromagnetic coupling, and cause deterioration of the reception sensitivity of that reception path. Alternatively, in that case, superposition of a harmonic of a high-output transmission signal transferred via a transmission path on the high-output transmission signal may cause deterioration of the signal quality of a transmission signal output from the front-end module.

The present disclosure is to address the above problems, and provides a radio frequency module and a communication device that reduce deterioration of reception sensitivity or the quality of a transmission signal.

Solutions

A radio frequency module according to an aspect of the present disclosure is a radio frequency module including: a module board including a first principal surface and a second principal surface on opposite sides of the module board; an antenna connection terminal; an LC filter connected to the antenna connection terminal and including at least a first inductor which is a chip inductor; a transmission power amplifier; and a first circuit component disposed on a transmission path connecting the LC filter and the transmission power amplifier. The first inductor is disposed on the first principal surface, and one of the transmission power amplifier and the first circuit component is disposed on the second principal surface.

Advantageous Effects

According to the present disclosure, it is possible to provide a radio frequency module and a communication device that reduce deterioration of reception sensitivity.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Figure 1:
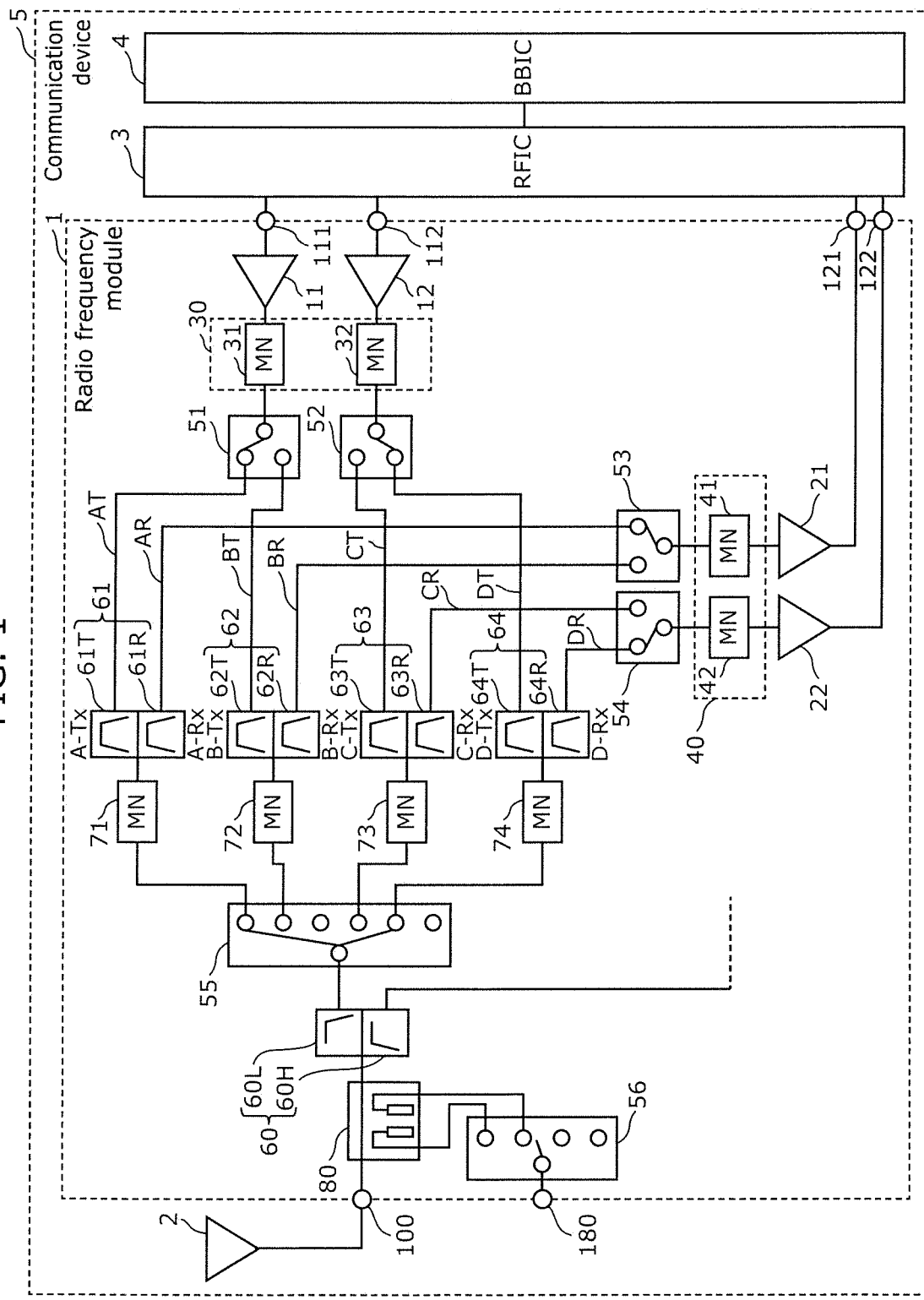
FIG. 1 illustrates a circuit configuration of a radio frequency module according to an embodiment.

Hereinafter, embodiments of the present disclosure will be described in detail. Note that the embodiments described below each illustrate a general or specific example. The numerical values, shapes, materials, constituent elements, the arrangement and connection of the constituent elements, etc., illustrated in the embodiment below are mere examples, and are therefore not intended to limit the present disclosure. Among the constituent elements in the following working examples and variations, constituent elements not recited in the independent claims will be described as optional constituent elements. In addition, the sizes of constituent elements and the ratios of the sizes illustrated in the drawings are not necessarily precise. In the drawings, essentially the same constituent elements share the same reference signs, and redundant descriptions will be omitted or simplified.

In the following description, terms indicating relationships between elements, e.g., "parallel" and "vertical", terms indicating the shapes of elements, e.g., "quadrilateral", and value ranges do not have the meanings in the strict sense only, but include essentially equivalent value ranges and meanings, for example deviations of about a few percent.

Additionally, in the following description, when A, B, and C are mounted on a board, and "C is disposed between A and B in a plan view of the board (or in a plan view of a principal surface of the board)", it means that a straight line connecting a given point in A and a given point in B passes through the region of C in a plan view of the board. Furthermore, a plan view of the board means that the board and circuit elements mounted on the board are orthographically projected on a plane parallel to the board.

In the following description, a "transmission path" refers to a transfer path including, for example, a line for propagating radio frequency transmission signals, an electrode directly connected to the line, and a terminal directly connected to the line or the electrode. A "reception path" refers to a transfer path including, for example, a line for propagating radio frequency reception signals, an electrode directly connected to the line, and a terminal directly connected to the line or the electrode. A "signal path" refers to a transfer path including, for example, a line for propagating radio frequency signals, an electrode directly connected to the line, and a terminal directly connected to the line or the electrode.

EMBODIMENT

[1. Circuit Configuration of Radio Frequency Module 1 and Communication Device 5]

FIG. 1 illustrates a circuit configuration of radio frequency module 1 according to an embodiment. As illustrated in this figure, communication device 5 includes radio frequency module 1, antenna 2, radio frequency (RF) signal processing circuit (RF integrated circuit (IC)) 3, and baseband signal processing circuit (BBIC) 4.

RFIC 3 is an RF signal processing circuit that processes a radio frequency signal which is to be transmitted by antenna 2 and a radio frequency signal which has been received by antenna 2. Specifically, RFIC 3 processes reception signals input via reception paths of radio frequency module 1 by down-conversion, for example, and outputs resultant reception signals to BBIC 4. RFIC 3 also processes transmission signals input from BBIC 4 by up-conversion, for example, and outputs resultant transmission signals to transmission paths of radio frequency module 1.

BBIC 4 is a circuit that performs signal processing using the intermediate frequency band lower than the frequency band of a radio frequency signal transferred by radio frequency module 1. The signal processed by BBIC 4 is used as, for example, an image signal for image display, or an audio signal for talk through a loudspeaker.

RFIC 3 also functions as a controller that controls connections of switches 51, 52, 53, 54, 55, and 56 included in radio frequency module 1 based on a communication band (frequency band) used. Specifically, RFIC 3 switches the connections of switches 51 to 56 included in radio frequency module 1 according to control signals (not illustrated). Note that the controller may be provided outside RFIC 3; for example in BBIC 4.

Antenna 2 is connected to antenna connection terminal 100 of radio frequency module 1, radiates a radio frequency signal output from radio frequency module 1, receives a radio frequency signal from outside, and outputs the received radio frequency signal to radio frequency module 1.

Note that in communication device 5 according to the present embodiment, antenna 2 and BBIC 4 are not essential.

Next, a detailed configuration of radio frequency module 1 will be described.

As illustrated in FIG. 1, radio frequency module 1 includes antenna connection terminal 100, transmission power amplifiers 11 and 12, reception low noise amplifiers 21 and 22, transmission filters 61T, 62T, 63T, and 64T, reception filters 61R, 62R, 63R, and 64R, transmission output matching circuit 30, reception input matching circuit 40, matching circuits 71, 72, 73, and 74, switches 51, 52, 53, 54, 55, and 56, transmission paths AT, BT, CT, and DT, reception paths AR, BR, CR, and DR, diplexer 60, coupler 80, and coupler output terminal 180.

Antenna connection terminal 100 is an antenna common terminal connected to antenna 2.

Transmission power amplifier 11 is an amplifier that amplifies radio frequency signals of communication band A (a first communication band) and communication band B (a second communication band) which belong to a first frequency band group. The radio frequency signals of communication bands A and B are input through transmission input terminal 111. Transmission power amplifier 12 is an amplifier that amplifies radio frequency signals of communication band C and communication band D which belong to a second frequency band group different from the first frequency band group. The radio frequency signals of communication bands C and D are input through transmission input terminal 112.

Reception low noise amplifier 21 is an amplifier that amplifies radio frequency signals of communication bands A and B with low noise, and outputs the amplified signals to reception output terminal 121. Reception low noise amplifier 22 is an amplifier that amplifies radio frequency signals of communication bands C and D with low noise, and outputs the amplified signals to reception output terminal 122.

Transmission path AT is for transferring transmission signals of communication band A. One end of transmission path AT is connected to antenna connection terminal 100, and the other end of transmission path AT is connected to transmission power amplifier 11. Transmission path BT is for transferring transmission signals of communication band B. One end of transmission path BT is connected to antenna connection terminal 100, and the other end of transmission path BT is connected to transmission power amplifier 11. Transmission path CT is for transferring transmission signals of communication band C. One end of transmission path CT is connected to antenna connection terminal 100, and the other end of transmission path CT is connected to transmission power amplifier 12. Transmission path DT is for transferring transmission signals of communication band D. One end of transmission path DT is connected to antenna connection terminal 100, and the other end of transmission path DT is connected to transmission power amplifier 12.

Reception path AR is for transferring reception signals of communication band A. One end of reception path AR is connected to antenna connection terminal 100, and the other end of reception path AR is connected to reception low noise amplifier 21. Reception path BR is for transferring reception signals of communication band B. One end of reception path BR is connected to antenna connection terminal 100, and the other end of reception path BR is connected to reception low noise amplifier 21. Reception path CR is for transferring reception signals of communication band C. One end of reception path CR is connected to antenna connection terminal 100, and the other end of reception path CR is connected to reception low noise amplifier 22. Reception path DR is for transferring reception signals of communication band D. One end of reception path DR is connected to antenna connection terminal 100, and the other end of reception path DR is connected to reception low noise amplifier 22.

Transmission filter 61T is disposed on transmission path AT. Among the transmission signals amplified by transmission power amplifier 11, transmission signals in the transmission range of communication band A pass through transmission filter 61T. Transmission filter 62T is disposed on transmission path BT. Among the transmission signals amplified by transmission power amplifier 11, transmission signals in the transmission range of communication band B pass through transmission filter 62T. Transmission filter 63T is disposed on transmission path CT. Among the transmission signals amplified by transmission power amplifier 12, transmission signals in the transmission range of communication band C pass through transmission filter 63T. Transmission filter 64T is disposed on transmission path DT. Among the transmission signals amplified by transmission power amplifier 12, transmission signals in the transmission range of communication band D pass through transmission filter 64T.

Reception filter 61R is disposed on reception path AR. Among reception signals input from antenna connection terminal 100, reception signals in the reception range of communication band A pass through reception filter 61R. Reception filter 62R is disposed on reception path BR. Among the reception signals input from antenna connection terminal 100, reception signals in the reception range of communication band B pass through reception filter 62R. Reception filter 63R is disposed on reception path CR. Among the reception signals input from antenna connection terminal 100, reception signals in the reception range of communication band C pass through reception filter 63R. Reception filter 64R is disposed on reception path DR. Among the reception signals input from antenna connection terminal 100, reception signals in the reception range of communication band D pass through reception filter 64R.

Transmission filter 61T and reception filter 61R constitute duplexer 61 having communication band A as the passband. Transmission filter 62T and reception filter 62R constitute duplexer 62 having communication band B as the passband. Transmission filter 63T and reception filter 63R constitute duplexer 63 having communication band C as the passband. Transmission filter 64T and reception filter 64R constitute duplexer 64 having communication band D as the passband.

Transmission output matching circuit 30 includes matching circuits 31 and 32. Matching circuit 31 is disposed on transmission paths AT and BT connecting transmission power amplifier 11 and transmission filters 61T and 62T, respectively, and matches the impedance of transmission power amplifier 11 with the impedances of transmission filters 61T and 62T. Matching circuit 32 is disposed on transmission paths CT and DT connecting transmission power amplifier 12 and transmission filters 63T and 64T, respectively, and matches the impedance of transmission power amplifier 12 with the impedances of transmission filters 63T and 64T. Matching circuits 31 and 32 each include a second inductor which is a chip inductor.

Reception input matching circuit 40 includes matching circuits 41 and 42. Matching circuit 41 is disposed on reception paths AR and BR connecting reception low noise amplifier 21 and reception filters 61R and 62R, respectively, and matches the impedance of reception low noise amplifier 21 with the impedances of reception filters 61R and 62R. Matching circuit 42 is disposed on reception paths CR and DR connecting reception low noise amplifier 22 and reception filters 63R and 64R, respectively, and matches the impedance of reception low noise amplifier 22 with the impedances of reception filters 63R and 64R. Matching circuits 41 and 42 each include a second inductor which is a chip inductor.

Switch 51 includes a common terminal and two selection terminals. The common terminal of switch 51 is connected to the output terminal of transmission power amplifier 11 via matching circuit 31. One of the selection terminals of switch 51 is connected to transmission filter 61T disposed on transmission path AT, and the other selection terminal of switch 51 is connected to transmission filter 62T disposed on transmission path BT. In this connection configuration, switch 51 switches between connection of the common terminal to one selection terminal and connection of the common terminal to the other selection terminal. In other words, switch 51 switches connection and disconnection of transmission power amplifier 11 with transmission path AT, and also switches connection and disconnection of transmission power amplifier 11 with transmission path BT. Switch 51 is a single pole double throw (SPDT) switch circuit, for example.

Switch 52 includes a common terminal and two selection terminals. The common terminal of switch 52 is connected to the output terminal of transmission power amplifier 12 via matching circuit 32. One of the selection terminals of switch 52 is connected to transmission filter 63T disposed on transmission path CT, and the other selection terminal of switch 52 is connected to transmission filter 64T disposed on transmission path DT. In this connection configuration, switch 52 switches between connection of the common terminal to one selection terminal and connection of the common terminal to the other selection terminal. In other words, switch 52 switches connection and disconnection of transmission power amplifier 12 with transmission path CT, and also switches connection and disconnection of transmission power amplifier 12 with transmission path DT. Switch 52 is an SPDT switch circuit, for example.

Switch 53 includes a common terminal and two selection terminals. The common terminal of switch 53 is connected to the input terminal of reception low noise amplifier 21 via matching circuit 41. One of the selection terminals of switch 53 is connected to reception filter 61R disposed on reception path AR, and the other selection terminal of switch 53 is connected to reception filter 62R disposed on reception path BR. In this connection configuration, switch 53 switches between connection of the common terminal to one selection terminal and connection of the common terminal to the other selection terminal. In other words, switch 53 switches connection and disconnection of reception low noise amplifier 21 with reception path AR, and also switches connection and disconnection of reception low noise amplifier 21 with reception path BR. Switch 53 is an SPDT switch circuit, for example.

Switch 54 includes a common terminal and two selection terminals. The common terminal of switch 54 is connected to the input terminal of reception low noise amplifier 22 via matching circuit 42. One of the selection terminals of switch 54 is connected to reception filter 63R disposed on reception path CR, and the other selection terminal of switch 54 is connected to reception filter 64R disposed on reception path DR. In this connection configuration, switch 54 switches between connection of the common terminal to one selection terminal and connection of the common terminal to the other selection terminal. In other words, switch 54 switches connection and disconnection of reception low noise amplifier 22 with reception path CR, and also switches connection and disconnection of reception low noise amplifier 22 with reception path DR. Switch 54 is an SPDT switch circuit, for example.

Switch 55 is an example of an antenna switch. Switch 55 is connected to antenna connection terminal 100 via diplexer 60, and switches (1) connection of antenna connection terminal 100 to transmission path AT and reception path AR, (2) connection of antenna connection terminal 100 to transmission path BT and reception path BR, (3) connection of antenna connection terminal 100 to transmission path CT and reception path CR, and (4) connection of antenna connection terminal 100 to transmission path DT and reception path DR. Note that switch 55 includes a multiple-connection switch circuit capable of simultaneously establishing two or more of the connections (1) to (4) described above.

Matching circuit 71 is disposed on a path connecting switch 55 and duplexer 61, and matches the impedance of antenna 2 and switch 55 with the impedance of duplexer 61. Matching circuit 72 is disposed on a path connecting switch 55 and duplexer 62, and matches the impedance of antenna 2 and switch 55 with the impedance of duplexer 62. Matching circuit 73 is disposed on a path connecting switch 55 and duplexer 63, and matches the impedance of antenna 2 and switch 55 with the impedance of duplexer 63. Matching circuit 74 is disposed on a path connecting switch 55 and duplexer 64, and matches the impedance of antenna 2 and switch 55 with the impedance of duplexer 64. Matching circuits 71 to 74 each include a second inductor which is a chip inductor.

Diplexer 60 is an example of a multiplexer, and includes filters 60L and 60H. Filter 60L is an example of an LC filter that includes a first inductor which is a chip inductor. Filter 60L is a filter having, as the passband, a frequency range including the first frequency band group and the second frequency band group. Filter 60H is an example of an LC filter that includes a first inductor which is a chip inductor. Filter 60H is a filter having, as the passband, a frequency range including another frequency band group different from the first frequency band group and the second frequency band group. One terminal of filter 60L and one terminal of filter 60H are connected commonly to antenna connection terminal 100. Note that when the first frequency band group and the second frequency band group are lower than the above other frequency band group, filter 60L may be a low-pass filter and filter 60H may be a high-pass filter. Diplexer 60 may include only filter 60L having a chip inductor, and in such a case, may be a matching circuit having an impedance matching function.

Coupler 80 and switch 56 form a circuit that monitors the power intensity of radio frequency signals transferred between antenna connection terminal 100 and switch 55, and output the monitored power intensity to, for example, RFIC 3 via coupler output terminal 180.

Note that transmission filters 61T to 64T and reception filters 61R to 64R described above may each be, but are not limited to, any of, for example, an acoustic wave filter that uses surface acoustic waves (SAWs), an acoustic wave filter that uses bulk acoustic waves (BAWs), an LC resonance filter, and a dielectric filter.

Transmission power amplifiers 11 and 12 and reception low noise amplifiers 21 and 22 are each configured using, for example, a field effect transistor (FET) or a hetero-junction bipolar transistor (HBT) including, for instance, an Si-based complementary metal oxide semiconductor (CMOS) or GaAs as a material.

Reception low noise amplifiers 21 and 22 and switches 53, 54, and 55 may be formed in a semiconductor integrated circuit (IC). Additionally, the semiconductor IC may include transmission power amplifiers 11 and 12 and switches 51 and 52. The semiconductor IC includes a CMOS, for example, and is specifically formed by the silicon on insulator (SOI) process. Accordingly, the semiconductor IC can be manufactured at low cost. Note that the semiconductor IC may include at least one of GaAs, SiGe, or GaN. Accordingly, a radio frequency signal having high quality of amplification and noise properties can be output.

Note that matching circuits 71 to 74, coupler 80, switch 56, and coupler output terminal 180 are not essential to the radio frequency module according to the present disclosure.

In the configuration of radio frequency module 1 described above, transmission power amplifier 11, matching circuit 31, switch 51, transmission filter 61T, matching circuit 71, switch 55, filter 60L, and transmission path AT are included in a first transmitter circuit that transfers transmission signals of communication band A to antenna connection terminal 100. Filter 60L, switch 55, matching circuit 71, reception filter 61R, switch 53, matching circuit 41, reception low noise amplifier 21, and reception path AR are included in a first receiver circuit that transfers reception signals of communication band A from antenna 2 via antenna connection terminal 100.

Transmission power amplifier 11, matching circuit 31, switch 51, transmission filter 62T, matching circuit 72, switch 55, filter 60L, and transmission path BT are included in a second transmitter circuit that transfers transmission signals of communication band B to antenna connection terminal 100. Filter 60L, switch 55, matching circuit 72, reception filter 62R, switch 53, matching circuit 41, reception low noise amplifier 21, and reception path BR are included in a second receiver circuit that transfers reception signals of communication band B from antenna 2 via antenna connection terminal 100.

Transmission power amplifier 12, matching circuit 32, switch 52, transmission filter 63T, matching circuit 73, switch 55, filter 60L, and transmission path CT are included in a third transmitter circuit that transfers transmission signals of communication band C to antenna connection terminal 100. Filter 60L, switch 55, matching circuit 73, reception filter 63R, switch 54, matching circuit 42, reception low noise amplifier 22, and reception path CR are included in a third receiver circuit that transfers reception signals of communication band C from antenna 2 via antenna connection terminal 100.

Transmission power amplifier 12, matching circuit 32, switch 52, transmission filter 64T, matching circuit 74, switch 55, filter 60L, and transmission path DT are included in a fourth transmitter circuit that transfers transmission signals of communication band D to antenna connection terminal 100. Filter 60L, switch 55, matching circuit 74, reception filter 64R, switch 54, matching circuit 42, reception low noise amplifier 22, and reception path DR are included in a fourth receiver circuit that transfers reception signals of communication band D from antenna 2 via antenna connection terminal 100.

According to the above circuit configuration, radio frequency module 1 can simultaneously transmit, receive, and/or transfer a radio frequency signal of communication band A or B and a radio frequency signal of communication band C or D.

Note that in the radio frequency module according to the present disclosure, the above four transmitter circuits and four receiver circuits need not be connected to antenna connection terminal 100 via switch 55, and may be connected to antenna 2 via different terminals. It is sufficient if the radio frequency module according to the present disclosure includes filter 60L and at least one of the first to fourth transmitter circuits. It is sufficient if the first transmitter circuit includes transmission power amplifier 11 in addition to filter 60L.

Here, in the case of mounting each circuit element included in radio frequency module 1 on a single module board as a small front-end circuit, it is necessary to reduce the layout area for circuit components on the module board surface. In such a case, electromagnetic coupling is expected between a circuit component disposed on transmission path AT or BT and diplexer 60 when a high-power transmission signal output from transmission power amplifier 11 is transferred via transmission path AT or BT. In that case, a harmonic of a high-output transmission signal transferred via transmission path AT or BT flows or spurious waves of intermodulation distortion between the transmission signal and another radio frequency signal flow into a reception path due the electromagnetic coupling, thereby causing deterioration of the reception sensitivity of that reception path. Alternatively, in that case, the signal quality of a transmission signal output from the radio frequency module is expected to deteriorate when a harmonic of a high-output transmission signal transferred via transmission path AT or BT superposes on the high-output transmission signal.

To address this, radio frequency module 1 according to the present embodiment has a configuration that reduces electromagnetic coupling between a chip inductor included in diplexer 60 and a circuit component disposed on a transmission path. The following describes a configuration of radio frequency module 1 according to the present embodiment that reduces the above electromagnetic coupling.

[2. Arrangement of Circuit Elements of Radio Frequency Module 1A According to Working Example 1]

Figure 2A:
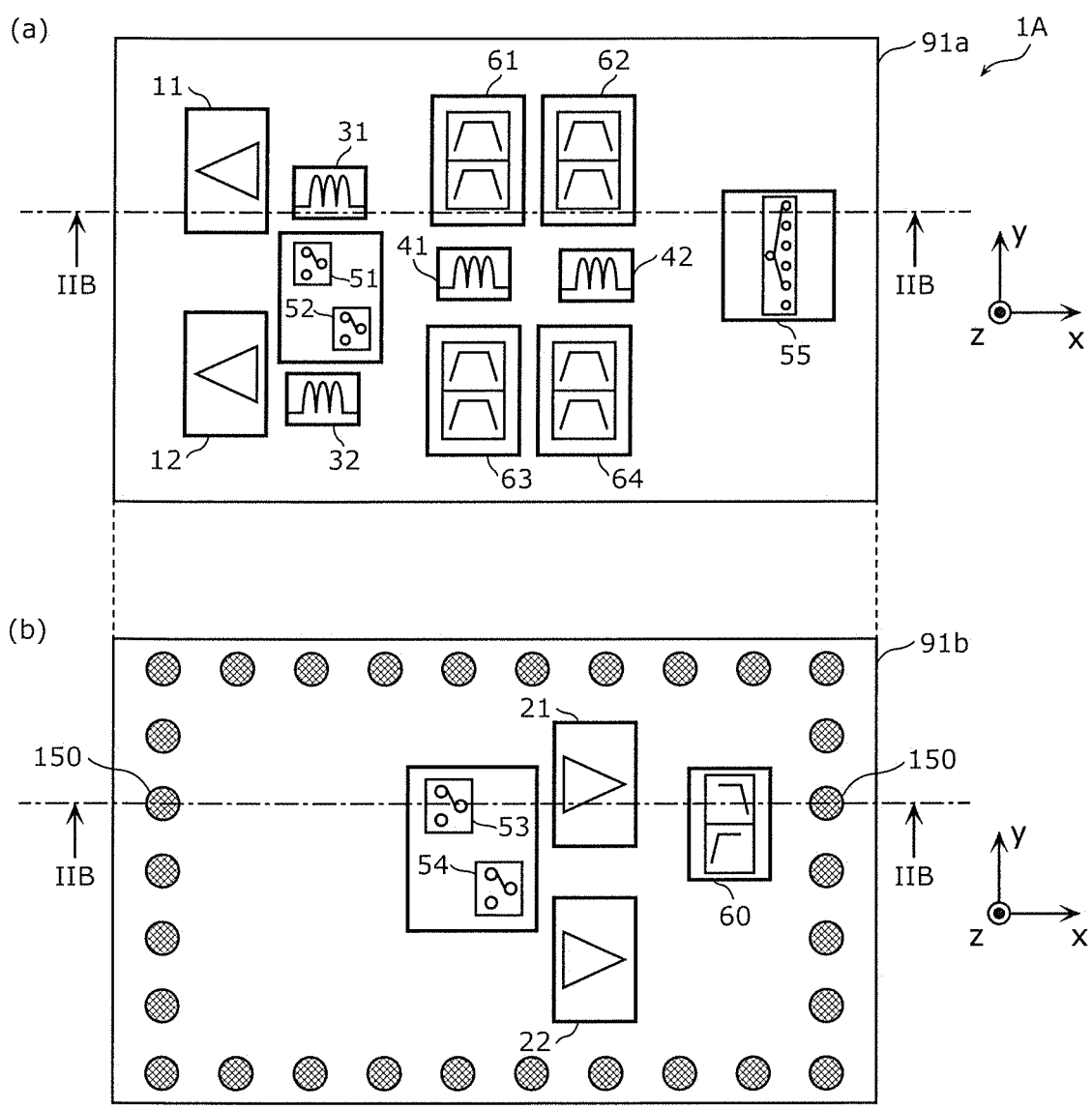
FIG. 2A is a schematic diagram illustrating a plan view configuration of a radio frequency module according to Working Example 1.
Figure 2B:
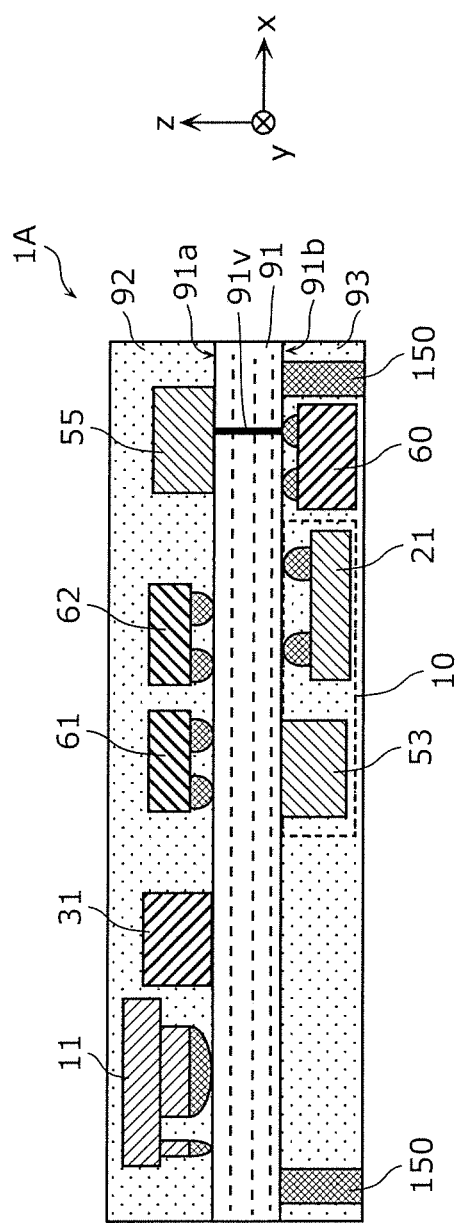
FIG. 2B is a schematic diagram illustrating a cross-sectional configuration of the radio frequency module according to Working Example 1.

FIG. 2A is a schematic diagram illustrating a plan view configuration of radio frequency module 1A according to Working Example 1. FIG. 2B is a schematic diagram illustrating a cross-sectional configuration of radio frequency module 1A according to Working Example 1, and is specifically a cross-sectional view taken at line IIB-IIB in FIG. 2A. Note that part (a) of FIG. 2A illustrates how circuit elements are arranged when, of principal surfaces 91a and 91b located on opposite sides of module board 91, principal surface 91a is viewed from the z-axis positive side. Part (b) of FIG. 2A is a perspective view illustrating how circuit elements are arranged when principal surface 91b is viewed from the z-axis positive side.

Radio frequency module 1A according to Working Example 1 is to specifically show an arrangement of circuit elements included in radio frequency module 1 according to the embodiment.

As illustrated in FIG. 2A and FIG. 2B, radio frequency module 1A according to this working example includes module board 91 and resin components 92 and 93 in addition to the circuit configuration illustrated in FIG. 1.

Module board 91 is a board which includes principal surface 91a (a second principal surface) and principal surface 91b (a first principal surface) on opposite sides of module board 91, and on which the above-described transmitter circuits and receiver circuits are mounted. Examples of a board used for module board 91 include a low temperature co-fired ceramics (LTCC) board having a configuration in which a plurality of dielectric layers are stacked, a high temperature co-fired ceramics (HTCC) board, a component-embedded board, a board having a redistribution layer (RDL), and a printed circuit board.

Resin component 92 is disposed on principal surface 91a of module board 91, and covers a part of the transmitter circuits, a part of the receiver circuits, and principal surface 91a of module board 91. Resin component 92 has a function to ensure the reliability of circuit elements included in the transmitter circuits and receiver circuits, such as the mechanical strength and moisture resistance. Resin component 93 is disposed on principal surface 91b of module board 91, and covers a part of the transmitter circuits, a part of the receiver circuits, and principal surface 91b of module board 91. Resin component 93 has a function to ensure the reliability of circuit elements included in the transmitter circuits and receiver circuits, such as the mechanical strength and moisture resistance. Note that resin components 92 and 93 are not essential to the radio frequency module according to the present disclosure.

Matching circuits 31, 32, 41, 42, 71 to 74 each include at least a chip inductor.

As illustrated in FIG. 2A and FIG. 2B, in radio frequency module 1A according to this working example, transmission power amplifiers 11 and 12, duplexers 61 to 64, matching circuits 31, 32, 41, and 42, and switches 51, 52, and 55 are surface-mounted on principal surface 91a of module board 91. Reception low noise amplifiers 21 and 22, switches 53 and 54, and diplexer 60 are surface-mounted on principal surface 91b of module board 91. Although matching circuits 71 to 74 and coupler 80 are not illustrated in FIG. 2A and FIG. 2B, they may be surface-mounted on any of principal surfaces 91a and 91b of module board 91, or may be embedded in module board 91.

In this working example, transmission power amplifiers 11 and 12 are disposed on principal surface 91a. Switches 51, 52, and 55, duplexers 61 to 64, and matching circuits 31 and 32 are first circuit components disposed on any of transmission paths AT to DT, and are disposed on principal surface 91a. Diplexer 60 is disposed on principal surface 91b.

According to the above configuration, diplexer 60 is disposed on principal surface 91b of module board 91, whereas transmission power amplifiers 11 and 12 and the first circuit components disposed on any of transmission paths AT to DT are disposed on principal surface 91a. In other words, diplexer 60, transmission power amplifiers 11 and 12, and the first circuit components are disposed such that module board 91 is interposed between (i) diplexer 60 and (ii) transmission power amplifiers 11 and 12 and the first circuit components. According to this, it is possible to reduce electromagnetic coupling between (i) diplexer 60 and (ii) transmission power amplifiers 11 and 12 and the first circuit components which occurs when a high-power transmission signal of any of communication bands A to D output from transmission power amplifier 11 or 12 is transferred via any of transmission paths AT to DT. Thus, it is possible to reduce deterioration of the reception sensitivity which occurs when a transmission signal of any of communication bands A to D flows, a harmonic flows, or spurious waves of intermodulation distortion between a transmission signal amplified by transmission power amplifier 11 and a transmission signal amplified by transmission power amplifier 12 flow into any of reception paths AR to DR without passing through any circuit components on the transmission paths. It is also possible to reduce the deterioration of the signal quality of a transmission signal output from radio frequency module 1A which occurs when a harmonic of a high-output transmission signal transferred via any of transmission paths AT to DT superposes on the high-output transmission signal.

Note that radio frequency module 1A according to this working example has a configuration in which transmission power amplifiers 11 and 12, switches 51, 52, and 55, duplexers 61 to 64, and matching circuits 31 and 32 are mounted on principal surface 91a, whereas diplexer 60 is mounted on principal surface 91*b*; however, the radio frequency module according to the present disclosure is not limited to this configuration.

It is sufficient if the radio frequency module according to the present disclosure has a configuration in which transmission power amplifiers 11 and 12 and at least one of the following circuit components (a first circuit component) are mounted on principal surface 91*a*. It is sufficient if the first circuit component is at least one of:

(1) the inductor of matching circuit 31 or the inductor of matching circuit 32;

(2) switch 51 or 52;

(3) any of transmission filters 61T to 64T or any of duplexers 61 to 64; or (4) switch 55.

According to this, as compared to a radio frequency module having a configuration in which diplexer 60 and the circuit components (1) to (4) above are disposed on the same principal surface, it is possible to reduce deterioration of the reception sensitivity which occurs when a transmission signal of any of communication bands A to D flows, a harmonic flows, or spurious waves of intermodulation distortion between a transmission signal amplified by transmission power amplifier 11 and a transmission signal amplified by transmission power amplifier 12 flow into any of reception paths AR to DR without passing through any circuit components on the transmission paths. It is also possible to reduce the deterioration of the signal quality of a transmission signal output from radio frequency module 1A which occurs when a harmonic of a high-output transmission signal transferred via any of transmission paths AT to DT superposes on the high-output transmission signal.

The first circuit component is desirably (1) the inductor of matching circuit 31 or the inductor of matching circuit 32, in particular.

When electromagnetic coupling occurs between diplexer 60 and the inductor of matching circuit 31 or the inductor of matching circuit 32, a transmission signal reaches antenna connection terminal 100 or a reception path without passing through most of the circuit components (such as switches 51 and 52, duplexers 61 to 64, and switch 55) disposed on a transmission path between diplexer 60 and the inductor of matching circuit 31 or the inductor of matching circuit 32. Consequently, the transmission signal is output from antenna connection terminal 100 with spurious wave components other than the transmission signal still remaining. As a result, the quality of the transmission signal and the reception sensitivity are severely impaired.

In view of this, diplexer 60 and the inductor of matching circuit 31 or the inductor of matching circuit 32 are disposed with module board 91 interposed therebetween. According to this, it is possible to reduce electromagnetic coupling between diplexer 60 and the inductor of matching circuit 31 or the inductor of matching circuit 32 which occurs when a high-power transmission signal of any of communication bands A to D output from transmission power amplifier 11 or 12 is transferred via any of transmission paths AT to DT. As a result, it is possible to effectively reduce deterioration of the quality of a transmission signal and deterioration of the reception sensitivity.

The first circuit component is desirably (3) any of transmission filters 61T to 64T or any of duplexers 61 to 64, in particular.

When electromagnetic coupling occurs between diplexer 60 and any of transmission filters 61T to 64T or between diplexer 60 and any of duplexers 61 to 64, a transmission signal reaches a reception path via a transmission filter then a reception filter. Consequently, the transmission signal flows into the reception path with spurious wave components other than the transmission signal still remaining. As a result, the reception sensitivity is severely impaired.

In view of this, diplexer 60 and any of transmission filters 61T to 64T or any of duplexers 61 to 64 are disposed with module board 91 interposed therebetween. According to this, it is possible to reduce electromagnetic coupling between diplexer 60 and any of transmission filters 61T to 64T or between diplexer 60 and any of duplexers 61 to 64 which occurs when a high-power transmission signal of any of communication bands A to D output from transmission power amplifier 11 or 12 is transferred via any of transmission paths AT to DT. As a result, it is possible to effectively reduce deterioration of the reception sensitivity.

Note that module board 91 desirably has a multi-layer structure in which a plurality of dielectric layers are stacked, and at least one of the dielectric layers desirably has a ground electrode pattern formed therein. This enhances the electromagnetic-field shielding function of module board 91.

In radio frequency module 1A according to this working example, a plurality of external-connection terminals 150 are disposed on principal surface 91*b* of module board 91. Radio frequency module 1A transmits and receives electric signals to and from a motherboard that is disposed on the z-axis negative side of radio frequency module 1A, via the plurality of external-connection terminals 150. Some of external-connection terminals 150 are set to the ground potential of the motherboard. Of principal surfaces 91*a* and 91*b*, transmission power amplifiers 11 and 12 that cannot be readily reduced in profile are not disposed on principal surface 91*b* facing the motherboard, but reception low noise amplifiers 21 and 22 and switches 53 and 54 that can be readily reduced in profile are disposed on principal surface 91*b*, thus enabling profile reduction of radio frequency module 1A as a whole. Moreover, since a plurality of external-connection terminals 150 that are used as ground electrodes are disposed in the vicinity of reception low noise amplifiers 21 and 22 that have a significant impact on the reception sensitivity of the receiver circuits, it is possible to reduce deterioration of the reception sensitivity of the receiver circuits.

As illustrated in FIG. 2A and FIG. 2B, external-connection terminals 150 may be columnar electrodes penetrating through resin component 93 in the z-axis direction, or may be bump electrodes formed on principal surface 91*b*.

In radio frequency module 1A according to this working example, transmission power amplifiers 11 and 12 are mounted on principal surface 91*a*.

Among the circuit components included in radio frequency module 1A, transmission power amplifiers 11 and 12 are components that generate a large amount of heat. To enhance the heat dissipating properties of radio frequency module 1A, it is important to dissipate heat generated by transmission power amplifiers 11 and 12 to the motherboard via a heat dissipation path having small thermal resistance. If transmission power amplifiers 11 and 12 are mounted on principal surface 91*b*, electrode lines connected to transmission power amplifiers 11 and 12 are disposed on principal surface 91*b*. Thus, the heat dissipation path in such a case includes a heat dissipation path passing only through a planar line pattern on principal surface 91*b* (along the xy plane direction). Since this planar line pattern is formed with a metal thin film, the thermal resistance is large. Consequently, the heat dissipating properties decrease if transmission power amplifiers 11 and 12 are disposed on principal surface 91b.

In contrast, when transmission power amplifiers 11 and 12 are mounted on principal surface 91a, transmission power amplifiers 11 and 12 and external-connection terminals 150 can be connected via a penetrating electrode that penetrates through module board 91 between principal surfaces 91a and 91b. Thus, the heat dissipation paths of transmission power amplifiers 11 and 12 can exclude a heat dissipation path that passes only through a planar line pattern having large thermal resistance and formed along the xy plane direction among the lines in module board 91. Accordingly, it is possible to provide miniaturized radio frequency module 1A having enhanced heat dissipating properties for dissipating heat from transmission power amplifiers 11 and 12 to the motherboard.

According to the above configuration that enhances the heat dissipating properties of radio frequency module 1A, the arrangement of the circuit components is restricted since components such as the external-connection terminals that dissipate heat are disposed in a region of principal surface 91b opposite transmission power amplifiers 11 and 12 in the z-axis direction. In the meantime, since a high-power transmission signal flows into a transmission path connecting transmission power amplifier 11 and switch 51, it is desirable that the transmission path be as short as possible. In view of this, transmission power amplifier 11 and switch 51 are desirably disposed in opposite positions on opposite sides of module board 91; however, due to the above restriction, it is difficult to dispose switch 51 in a position opposite transmission power amplifier 11. Therefore, switch 51 is desirably disposed adjacent to transmission power amplifier 11 on principal surface 91a on which transmission power amplifier 11 is mounted.

It is desirable that in a plan view of module board 91, switch mounted on principal surface 91b and transmission power amplifier 11 mounted on principal surface 91a do not overlap, and switch 51 mounted on principal surface 91a and switch 53 mounted on principal surface 91b do not overlap.

According to this, switch 53 disposed on reception paths and transmission power amplifier 11 can be disposed with module board 91 interposed therebetween. In addition, a sufficient distance can be ensured between switch 53 and transmission power amplifier 11. Moreover, switch 53 disposed on reception paths and switch 51 disposed on transmission paths can be disposed with module board 91 interposed therebetween. In addition, a sufficient distance can be ensured between switches 53 and 51. Accordingly, isolation between the transmitter circuits and the receiver circuits further improves, thus enabling further reduction of deterioration of the reception sensitivity caused by a flow of a transmission signal, a harmonic, and spurious waves of intermodulation distortion into a reception path.

As illustrated in radio frequency module 1A according to this working example, it is desirable that the inductor of matching circuit 41 mounted on principal surface 91a and switch 53 mounted on principal surface 91b overlap in a plan view of module board 91. According to this, since the inductor of matching circuit 41 and switch 53 are disposed in opposite positions on opposite sides of module board 91, it is possible to make short the length of a line connecting the inductor of matching circuit 41 and switch 53. Accordingly, transfer loss in the reception paths can be reduced.

As illustrated in radio frequency module 1A according to this working example, it is desirable that at least one of duplexer 61 (or reception filter 61R) or duplexer 62 (or reception filter 62R) mounted on principal surface 91a and switch 53 mounted on principal surface 91b overlap in a plan view of module board 91. According to this, since at least one of duplexers 61 and 62 and switch 53 are disposed in opposite positions on opposite sides of module board 91, it is possible to make short the length of a line connecting at least one of duplexers 61 and 62 and switch 53. Accordingly, transfer loss in the reception paths can be reduced.

Furthermore, in radio frequency module 1A according to this working example, diplexer 60 and switch 55 overlap in a plan view of module board 91. In this working example, switch 55 and the first inductor are connected via via conductor 91v that penetrates through module board 91 between principal surfaces 91a and 91b.

According to this, since diplexer 60 and switch 55 are disposed in opposite positions on opposite sides of module board 91, it is possible to make short the length of a line connecting diplexer 60 and switch 55. As a result, transfer loss in both the transmission paths and the reception paths of radio frequency module 1A can be reduced.

As illustrated in radio frequency module 1A according to this working example, it is desirable that transmission power amplifier 11, switch 51, and duplexer 61 or 62 (or transmission filter 61T or 62T) be disposed on principal surface 91a in the stated order in a plan view of module board 91. According to this, transmission power amplifier 11, switch 51, and duplexer 61 or 62 are disposed on principal surface 91a in the same order as the electrical connection order. As a result, it is possible to make short the length of a line connecting transmission power amplifier 11, switch 51, and duplexer 61 or 62. Accordingly, transfer loss in the transmission paths can be reduced.

Note that reception low noise amplifiers 21 and 22 and switches 53 and 54 may be embedded in single semiconductor IC 10. This makes it possible to reduce the height on the principal surface 91b side in the z-axis direction, and reduce the component mounting area of principal surface 91b. Thus, radio frequency module 1A can be miniaturized.

[3. Arrangement of Circuit Elements of Radio Frequency Module 1B According to Working Example 2]

Figure 3A:
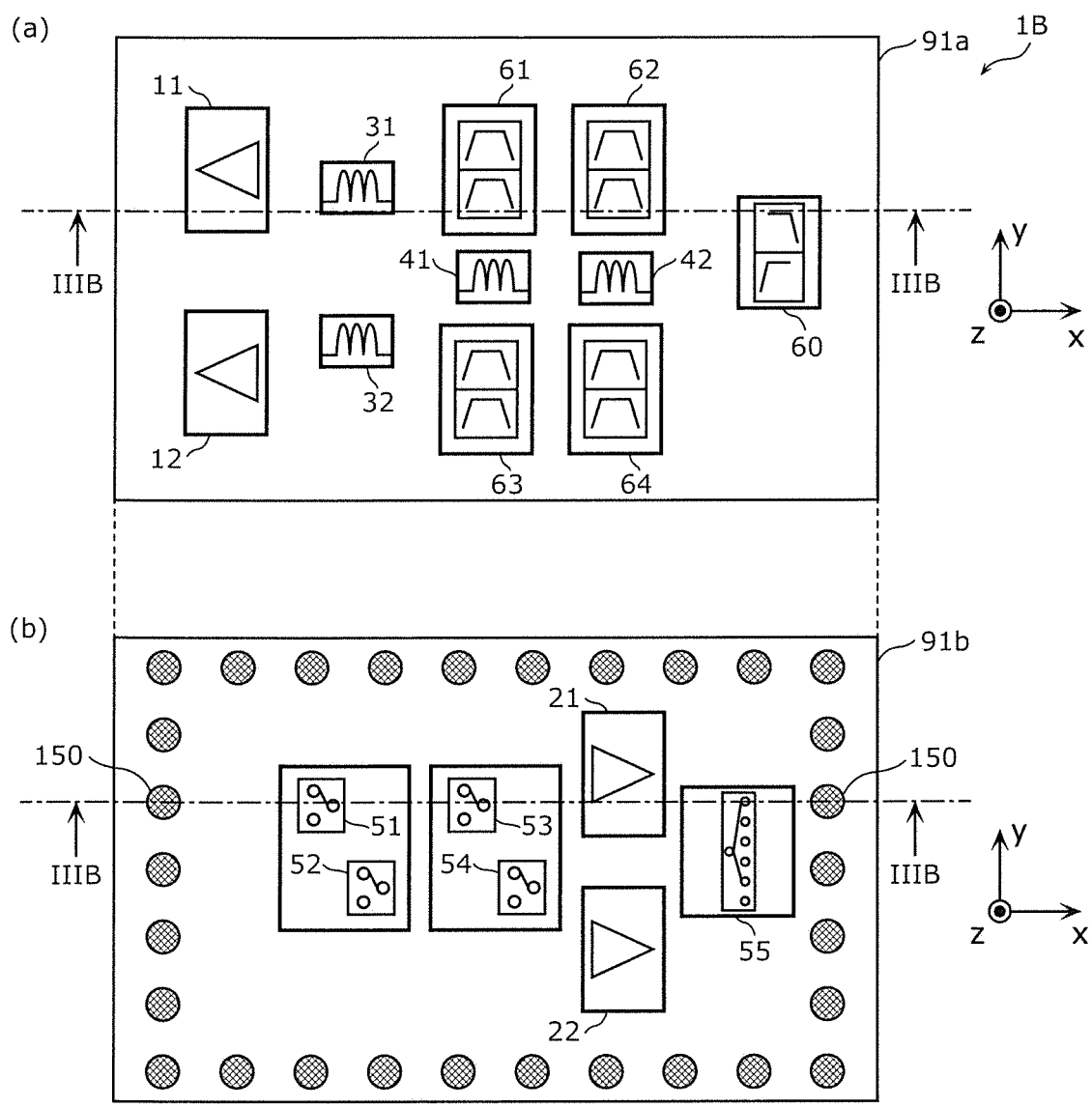
FIG. 3A is a schematic diagram illustrating a plan view configuration of a radio frequency module according to Working Example 2.
Figure 3B:
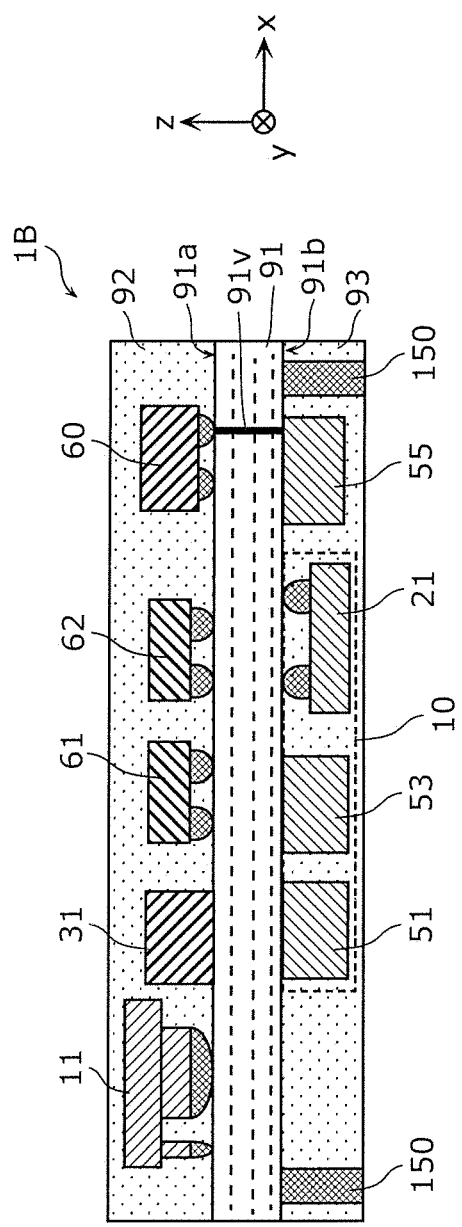
FIG. 3B is a schematic diagram illustrating a cross-sectional configuration of the radio frequency module according to Working Example 2.

FIG. 3A is a schematic diagram illustrating a plan view configuration of radio frequency module 1B according to Working Example 2. FIG. 3B is a schematic diagram illustrating a cross-sectional configuration of radio frequency module 1B according to Working Example 2, and is specifically a cross-sectional view taken at line IIIB-IIIB in FIG. 3A. Note that part (a) of FIG. 3A illustrates how circuit elements are arranged when, of principal surfaces 91a and 91b located on opposite sides of module board 91, principal surface 91a is viewed from the z-axis positive side. Part (b) of FIG. 3A is a perspective view illustrating how circuit elements are arranged when principal surface 91b is viewed from the z-axis positive side.

Radio frequency module 1B according to Working Example 2 is to specifically show an arrangement of circuit elements included in radio frequency module 1 according to the embodiment.

Radio frequency module 1B according to this working example is different from radio frequency module 1A according to Working Example 1 only in the positions of diplexer 60 and switches 51, 52, and 55 with respect to each other. Hereinafter, radio frequency module 1B according to this working example will be described, focusing on the aspects different from radio frequency module 1A according to Working Example 1 and omitting the description of the aspects that are the same as radio frequency module 1A.

Module board 91 is a board which includes principal surface 91*a* (a first principal surface) and principal surface 91*b* (a second principal surface) on opposite sides of module board 91. Examples of a board used for module board 91 include an LTCC board having a configuration in which a plurality of dielectric layers are stacked, an HTCC board, a component-embedded board, a board having an RDL, and a printed circuit board.

In radio frequency module 1B according to this working example, a plurality of external-connection terminals 150 are disposed on principal surface 91*b* of module board 91.

As illustrated in FIG. 3A and FIG. 3B, in radio frequency module 1B according to this working example, transmission power amplifiers 11 and 12, duplexers 61 to 64, matching circuits 31, 32, 41, and 42, and diplexer 60 are surface-mounted on principal surface 91*a* of module board 91. Reception low noise amplifiers 21 and 22, switches 51, 52, 53, 54, and 55 are surface-mounted on principal surface 91*b* of module board 91.

As illustrated in FIG. 3B, in radio frequency module 1B according to this working example, switches 51, 52, and 55 are mounted on principal surface 91*b*, whereas diplexer 60 is mounted on principal surface 91*a*. In other words, diplexer 60 and switches 51, 52, and 55 are disposed with module board 91 interposed therebetween.

According to the above configuration, it is possible to reduce the electromagnetic coupling between diplexer 60 and any of switches 51, 52, and 55 which occurs when a high-power transmission signal of any of communication bands A to D output from transmission power amplifier 11 or 12 is transferred via any of transmission paths AT to DT. Thus, it is possible to reduce deterioration of the reception sensitivity which occurs when a transmission signal of any of communication bands A to D flows, a harmonic flows, or spurious waves of intermodulation distortion between a transmission signal amplified by transmission power amplifier 11 and a transmission signal amplified by transmission power amplifier 12 flow into any of reception paths AR to DR without passing through any circuit components on the transmission paths. It is also possible to reduce the deterioration of the signal quality of a transmission signal output from radio frequency module 1B which occurs when a harmonic of a high-output transmission signal transferred via any of transmission paths AT to DT superposes on the high-output transmission signal.

Note that it is sufficient if at least one of switches 51, 52, and 55 is disposed on principal surface 91*b*.

Furthermore, in radio frequency module 1B according to this working example, diplexer 60 and switch 55 overlap in a plan view of module board 91. In this working example, switch 55 and the first inductor are connected via via conductor 91*v* that penetrates through module board 91 between principal surfaces 91*a* and 91*b*.

According to this, since diplexer 60 and switch 55 are disposed in opposite positions on opposite sides of module board 91, it is possible to make short the length of a line connecting diplexer 60 and switch 55. As a result, transfer loss in both the transmission paths and the reception paths of radio frequency module 1B can be reduced.

[4. Advantageous Effects Etc.]

Radio frequency module 1 according to the present embodiment is a radio frequency module including: module board 91 including principal surfaces 91*a* and 91*b* on opposite sides of module board 91; antenna connection terminal 100; diplexer 60 connected to antenna connection terminal 100 and including at least a first inductor which is a chip inductor; transmission power amplifier 11 that amplifies a transmission signal; and a first circuit component disposed on a transmission path connecting diplexer 60 and transmission power amplifier 11. The first inductor is disposed on principal surface 91*b*, and one of transmission power amplifier 11 and the first circuit component is disposed on principal surface 91*a*.

According to this, it is possible to reduce the electromagnetic coupling between diplexer 60 and one of transmission power amplifier 11 and the first circuit component which occurs when a high-power transmission signal of communication band A or B output from transmission power amplifier 11 is transferred via transmission path AT or BT. Thus, it is possible to reduce deterioration of the reception sensitivity which occurs when a transmission signal of communication band A or B flows, a harmonic flows, or spurious waves of intermodulation distortion between a transmission signal amplified by transmission power amplifier 11 and a transmission signal amplified by transmission power amplifier 12 flow into any of reception paths AR to DR without passing through any circuit components on the transmission paths. It is also possible to reduce deterioration of the signal quality of a transmission signal output from radio frequency module 1 which occurs when a harmonic of a high-output transmission signal transferred via transmission path AT or BT superposes on the high-output transmission signal.

The first circuit component may be at least one of:

(1) the inductor of matching circuit 31 or the inductor of matching circuit 32;

(2) switch 51 or 52;

(3) any of transmission filters 61T to 64T or any of duplexers 61 to 64; or (4) switch 55.

External-connection terminal 150 connected to a motherboard may be disposed on principal surface 91*b*, and transmission power amplifier 11 may be disposed on principal surface 91*a*.

Thus, the heat dissipation path of transmission power amplifier 11 can exclude a heat dissipation path that passes only through a planar line pattern having large thermal resistance among the lines in module board 91. Accordingly, it is possible to provide miniaturized radio frequency module 1 having enhanced heat dissipating properties for dissipating heat from transmission power amplifier 11 to the motherboard.

The first circuit component is desirably (1) the inductor of matching circuit 31 or the inductor of matching circuit 32, in particular.

According to this, it is possible to reduce the electromagnetic coupling between diplexer 60 and the inductor of matching circuit 31 or the inductor of matching circuit 32 which occurs when a high-power transmission signal of communication band A or B output from transmission power amplifier 11 is transferred via transmission path AT or BT. As a result, it is possible to effectively reduce deterioration of the quality of a transmission signal and deterioration of the reception sensitivity.

The first circuit component is desirably (3) any of transmission filters 61T to 64T or any of duplexers 61 to 64, in particular.

According to this, it is possible to reduce the electromagnetic coupling between diplexer 60 and any of transmission filters 61T to 64T or between diplexer 60 and any of duplexers 61 to 64 which occurs when a high-power transmission signal of communication band A or B output from transmission power amplifier 11 is transferred via transmission path AT or BT. As a result, it is possible to effectively reduce deterioration of the reception sensitivity.

The first inductor may be mounted on principal surface 91*a*, and switches 51, 52, and 55 may be mounted on principal surface 91*b*.

According to this, it is possible to reduce the electromagnetic coupling between diplexer 60 and one of transmission power amplifier 11 and the first circuit component which occurs when a high-power transmission signal of communication band A or B output from transmission power amplifier 11 is transferred via transmission path AT or BT. Thus, it is possible to reduce deterioration of the reception sensitivity which occurs when a transmission signal of communication band A or B flows, a harmonic flows, or spurious waves of intermodulation distortion between a transmission signal amplified by transmission power amplifier 11 and a transmission signal amplified by transmission power amplifier 12 flow into any of reception paths AR to DR without passing through any circuit components on the transmission paths. It is also possible to reduce deterioration of the signal quality of a transmission signal output from radio frequency module 1 which occurs when a harmonic of a high-output transmission signal transferred via transmission path AT or BT superposes on the high-output transmission signal.

The first inductor and switch 55 may overlap in a plan view of module board 91.

According to this, since diplexer 60 and switch 55 are disposed in opposite positions on opposite sides of module board 91, it is possible to make short the length of a line connecting diplexer 60 and switch 55. As a result, transfer loss in both the transmission paths and the reception paths of radio frequency module 1 can be reduced.

Communication device 5 includes: RFIC 3 configured to process a radio frequency signal which is to be transmitted by antenna 2 and a radio frequency signal which has been received by antenna 2; and radio frequency module 1 configured to transfer the radio frequency signals between antenna 2 and RFIC 3.

According to this, it is possible to provide communication device 5 that reduces deterioration of the reception sensitivity or deterioration of the quality of a transmission signal.

Other Embodiments, Etc.

Although a radio frequency module and a communication device according to an embodiment of the present disclosure have been described based on the embodiment and working examples, the radio frequency module and the communication device according to the present disclosure are not limited to the above embodiment and working examples. The present disclosure also encompasses: other embodiments implemented by arbitrarily combining constituent elements in the above embodiment and working examples; variations obtained by making various modifications to the above embodiment and working examples that are conceivable to a person skilled in the art within the scope of the essence of the present disclosure; and various apparatuses that include the above radio frequency module and communication device.

For example, in the radio frequency module and the communication device according to the above embodiment and working examples thereof, circuit elements and lines, for instance, may be interposed between circuit elements and paths that connect signal paths illustrated in the drawings.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure is widely applicable to communication apparatuses such as mobile phones as a radio frequency module disposed in a multiband-compatible front-end unit.

The invention claimed is:

1. A radio frequency module, comprising:
    a module board including a first principal surface and a second principal surface on opposite sides of the module board;
    an antenna connection terminal;
    an LC filter connected to the antenna connection terminal and including at least a first chip inductor disposed on the first principal surface;
    a transmission power amplifier; and
    a first circuit component disposed on a transmission path connecting the LC filter and the transmission power amplifier, wherein
    one of the transmission power amplifier and the first circuit component is disposed on the second principal surface.

2. The radio frequency module of claim 1, wherein
    the first circuit component is a second chip inductor connected to an output terminal of the transmission power amplifier.

3. The radio frequency module of claim 1, further comprising:
    an external-connection terminal connected to a motherboard and disposed on the first principal surface.

4. The radio frequency module of claim 3, wherein
    the transmission power amplifier is disposed on the second principal surface.

5. The radio frequency module of claim 1, further comprising
    an external-connection terminal connected to a motherboard and disposed on the first principal surface.

6. The radio frequency module of claim 5, wherein
    the first circuit component is one of a second chip indictor, a transmission filter, and a duplexer.

7. The radio frequency module of claim 1, further comprising:
    an external-connection terminal connected to a motherboard and disposed on the second principal surface.

8. The radio frequency module of claim 7, wherein
    the first circuit component is one of first switch and an antenna switch.

9. The radio frequency module of claim 8, wherein
    the first circuit component is the antenna switch, and
    a footprint of the first chip inductor overlaps a footprint of the antenna switch in a plan view of the module board.

10. The radio frequency module of claim 1, wherein the first circuit component is a first switch comprising:
    a common terminal connected to one of the output terminal of the transmission power amplifier and the second chip inductor;
    a first selection terminal connected to an end of a first transmission path via which a transmission signal of a first communication band is transferred; and a second selection terminal connected to an end of a second transmission path via which a transmission signal of a second communication band is transferred, the first switch being configured to switch between connection of the common terminal and the first selection terminal and connection of the common terminal and the second selection terminal.

11. The radio frequency module of claim 1, wherein the first circuit component is one of a transmission filter and a duplexer disposed on one of the first transmission path and the second transmission path.

12. The radio frequency module of claim 1, wherein the first circuit component is an antenna switch connected to one of the antenna connection terminal and the LC filter, and configured to switch connection and disconnection of the antenna connection terminal and the first transmission path, and switch connection and disconnection of the antenna connection terminal and the second transmission path.

13. A communication device, comprising:
a radio frequency (RF) signal processing circuit configured to process a radio frequency signal which is to be transmitted by an antenna and a radio frequency signal which has been received by the antenna; and
a radio frequency module configured to transfer the radio frequency signals between the antenna and the RF signal processing circuit, wherein
the radio frequency module comprises
a module board including a first principal surface and a second principal surface on opposite sides of the module board;
an antenna connection terminal;
an LC filter connected to the antenna connection terminal and including at least a first chip inductor disposed on the first principal surface;
a transmission power amplifier; and
a first circuit component disposed on a transmission path connecting the LC filter and the transmission power amplifier, wherein
one of the transmission power amplifier and the first circuit component is disposed on the second principal surface.

14. The communication device of claim 13, wherein the first circuit component is one of a:
a second chip inductor connected to an output terminal of the transmission power amplifier;
a first switch comprising
a common terminal connected to one of the output terminal of the transmission power amplifier and the second chip inductor;
a first selection terminal connected to an end of a first transmission path via which a transmission signal of a first communication band is transferred; and
a second selection terminal connected to an end of a second transmission path via which a transmission signal of a second communication band is transferred, the first switch being configured to switch between connection of the common terminal and the first selection terminal and connection of the common terminal and the second selection terminal; or
one of a transmission filter and a duplexer disposed on one of the first transmission and the second transmission path.

15. The communication device of claim 14, further comprising:
an external-connection terminal connected to a motherboard and disposed on the first principal surface, wherein
the first circuit component is one of the second chip inductor, the transmission filter, and the duplexer.

16. The communication device of claim 14, further comprising:
an external-connection terminal connected to a motherboard and disposed on the second principal surface, wherein
the first circuit component is one of the first switch and the antenna switch.

17. The communication device of claim 16, wherein
the first circuit component is the antenna switch, and
a footprint of the first chip inductor overlaps a footprint of the antenna switch in a plan view of the module board.

18. The communication device of claim 13, wherein
the first circuit component is an antenna switch connected to one of the antenna connection terminal and the LC filter, and configured to switch connection and disconnection of the antenna connection terminal and the first transmission path, and switch connection and disconnection of the antenna connection terminal and the second transmission path.

19. The communication device of claim 13, further comprising:
an external-connection terminal connected to a motherboard and disposed on the first principal surface, wherein
the transmission power amplifier is disposed on the second principal surface.

* * * * *